(12) United States Patent
Takeda et al.

(10) Patent No.: US 9,647,651 B2
(45) Date of Patent: May 9, 2017

(54) DELAY CIRCUIT AND SEMICONDUCTOR DEVICE

(71) Applicant: SII Semiconductor Corporation, Chiba-shi, Chiba (JP)

(72) Inventors: Takahisa Takeda, Chiba (JP); Tomomi Taniguchi, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 0 days.

(21) Appl. No.: 15/165,393

(22) Filed: May 26, 2016

(65) Prior Publication Data

US 2016/0359474 A1 Dec. 8, 2016

(30) Foreign Application Priority Data

Jun. 2, 2015 (JP) .................................. 2015-112308

(51) Int. Cl.
   *H03K 5/135* (2006.01)
   *H03K 5/24* (2006.01)
(52) U.S. Cl.
   CPC ............... *H03K 5/135* (2013.01); *H03K 5/24* (2013.01)
(58) Field of Classification Search
   USPC ........................................ 327/149, 158, 279
   See application file for complete search history.

(56) References Cited

U.S. PATENT DOCUMENTS

| 2012/0320640 | A1* | 12/2012 | Baurle | H02M 3/33507 363/21.17 |
| 2013/0038364 | A1* | 2/2013 | Tokairin | H03K 4/502 327/156 |
| 2014/0062442 | A1* | 3/2014 | Seymour | G06F 1/28 323/283 |
| 2015/0077076 | A1* | 3/2015 | Bhattad | G05F 1/56 323/280 |
| 2016/0359474 | A1* | 12/2016 | Takeda | H03K 5/24 |

FOREIGN PATENT DOCUMENTS

JP 2003-008410 A 1/2003

* cited by examiner

*Primary Examiner* — Adam Houston
(74) *Attorney, Agent, or Firm* — Brinks Gilson & Lione

(57) ABSTRACT

To provide a delay circuit improved in the accuracy of a delay time. A delay circuit is provided which includes a plurality of switches respectively provided between a plurality of constant current sources and a delay time adjustment terminal, a control circuit which ON/OFF-controls the switches, and a comparator circuit which compares a voltage of the delay time adjustment terminal and a reference voltage. The control circuit sequentially turns ON the switches every preset period after a signal is inputted to a signal input terminal and sets as a delay time, a time taken for the comparator circuit to detect that the voltage of the delay time adjustment terminal exceeds the reference voltage.

5 Claims, 3 Drawing Sheets

US 9,647,651 B2

DELAY CIRCUIT AND SEMICONDUCTOR DEVICE

RELATED APPLICATIONS

This application claims priority under 35 U.S.C. §119 to Japanese Patent Application No. 2015-112308 filed Jun. 2, 2015, the entire content of which is hereby incorporated by reference.

BACKGROUND OF THE INVENTION

Field of the Invention
The present invention relates to a delay circuit.
Background Art
FIG. 3 is a circuit diagram illustrating a delay circuit according to a related art.
The related art delay circuit is of an analog type and provides a delay time determined depending on the charging characteristics of a capacitor.
FIG. 4 is a timing chart of the delay circuit according to the related art.
A delay time Td of the delay circuit is expressed by the following equation:

$$Td = Cd \times Vref/I1$$

where Cd is a capacitance value of the capacitor, Vref is a reference voltage, and I1 is a charging current. When it is desired to adjust the delay time Td, the capacitor is provided externally and the capacitance value Cd thereof is adjusted.
[Patent Document 1] Japanese Patent Application Laid-Open No. 2003-8410

SUMMARY OF THE INVENTION

When, however, the delay time Td is adjusted by the external capacitor, a fluctuation in the capacitance value Cd (e.g., ±10%) directly appears as a variation in the delay time Td.
The present invention has been invented to solve the above-described problems. A delay circuit of the present invention is configured as follows:
The delay circuit is provided which includes a plurality of switches respectively provided between a plurality of constant current source and a delay time adjustment terminal, a control circuit which ON/OFF-controls the switches, and a comparator circuit which compares a voltage of the delay time adjustment terminal and a reference voltage. In the delay circuit, the control circuit sequentially turns ON the switches every preset period after a signal is inputted to a signal input terminal and sets as a delay time, a time taken for the comparator circuit to detect that the voltage of the delay time adjustment terminal exceeds the reference voltage.
According to the delay circuit of the present invention, since a variation in external resistance does not influence a delay time, it is possible to reduce a variation in the delay time.

DETAILED DESCRIPTION OF THE PREFERRED EMBODIMENTS

Figure 1:
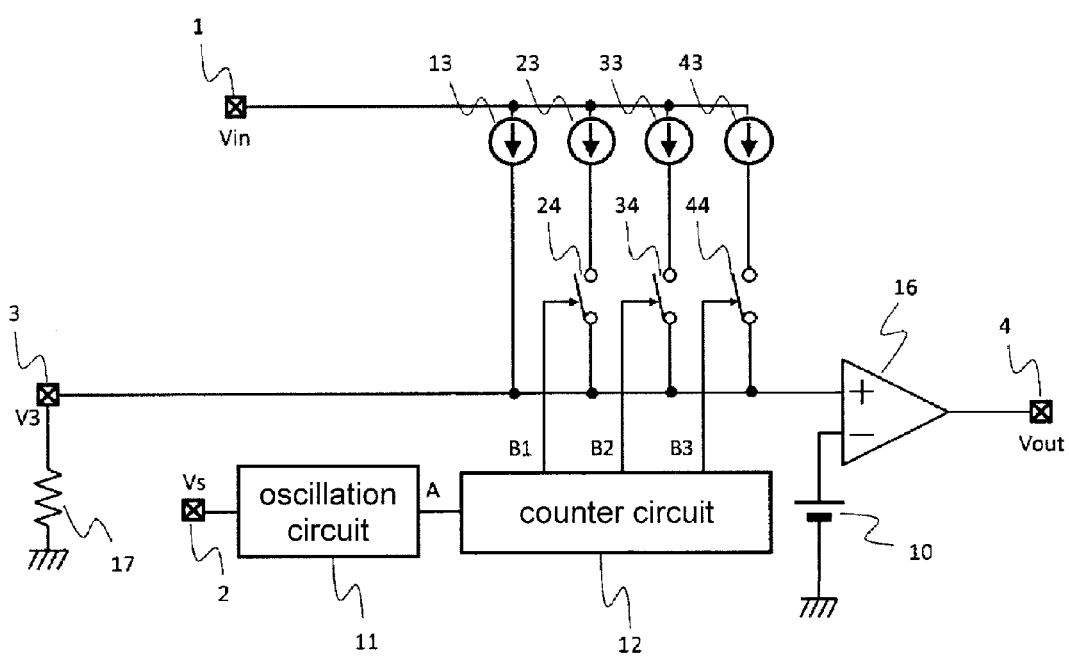
FIG. 1 is a circuit diagram illustrating the configuration of a delay circuit according to the present embodiment.

A delay circuit of the present invention will hereinafter be described with reference to the accompanying drawings.
FIG. 1 is a circuit diagram illustrating the configuration of the delay circuit according to the present embodiment.
The delay circuit is equipped with a power supply terminal 1, a signal input terminal 2, a delay time adjustment terminal 3, and an output terminal 4, and a reference voltage circuit 10, an oscillation circuit 11, a counter circuit 12, constant current sources 13, 23, 33, and 43, switches 24, 34, and 44, and a comparator circuit 16. The delay time adjustment terminal 3 is connected with a resistor 17 for delay time adjustment. The oscillation circuit 11 and the counter circuit 12 configures a control circuit which ON/OFF-controls the switches 24, 34, and 44.
The comparator circuit 16 has an inversion input terminal connected to the reference voltage circuit 10, a non-inversion input terminal connected to the delay time adjustment terminal 3, and an output terminal connected to the output terminal 4 of the delay circuit. The reference voltage circuit 10 has terminals, the other of which is connected to a ground terminal. The oscillation circuit 11 has an input terminal connected to the signal input terminal 2, and an output terminal (node A) connected to an input terminal of the counter circuit 12. The constant current source 13 has one terminal connected to the power supply terminal 1, and the other terminal connected to the delay time adjustment terminal 3. The constant current source 23 has one terminal connected to the power supply terminal 1, and the other terminal connected to one terminal of the switch 24. The constant current source 33 has one terminal connected to the power supply terminal 1, and the other terminal connected to one terminal of the switch 34. The constant current source 43 has one terminal connected to the power supply terminal 1, and the other terminal connected to one terminal of the switch 44. The switch 24 has the other terminal connected to the delay time adjustment terminal 3, and a control terminal connected to an output terminal B1 of the counter circuit 12. The switch 34 has the other terminal connected to the delay time adjustment terminal 3, and a control terminal connected to an output terminal B2 of the counter circuit 12. The switch 44 has the other terminal connected to the delay time adjustment terminal 3, and a control terminal connected to an output terminal 133 of the counter circuit 12.
The operation of the delay circuit according to the present embodiment will next be described using a timing chart illustrated in FIG. 2.
In an initial state, a voltage V3 of the delay time adjustment terminal 3 becomes the product of a resistance value of the resistor 17 and a current value of a current made to flow by the constant current source 13. When a detection signal Vs is inputted to the signal input terminal 2, the oscillation circuit 11 outputs a clock (A). The counter circuit 12 sequentially outputs control signals to the output terminals B1 to B3 in response to the inputted clock to thereby control the switches 24, 34, and 44. For example, each time three clock pulses of A are inputted, the switches are sequentially turned ON.
Thus, the currents of the respective current sources are sequentially added to each other so that the voltage V3 of the delay time adjustment terminal 3 rises. Further, when the voltage V3 of the delay time adjustment terminal 3 exceeds a reference voltage Vref outputted from the reference voltage circuit 10, the comparator circuit 16 inverts and outputs an output signal Vout.

A delay time Td is determined by the oscillation circuit 11 and the counter circuit 12. Further, the accuracy of the delay time Td is the accuracy of the clock of the oscillation circuit 11. Accordingly, the oscillation circuit 11 is capable of adjusting the delay time with high accuracy using a method such as trimming or the like.

Figure 2:
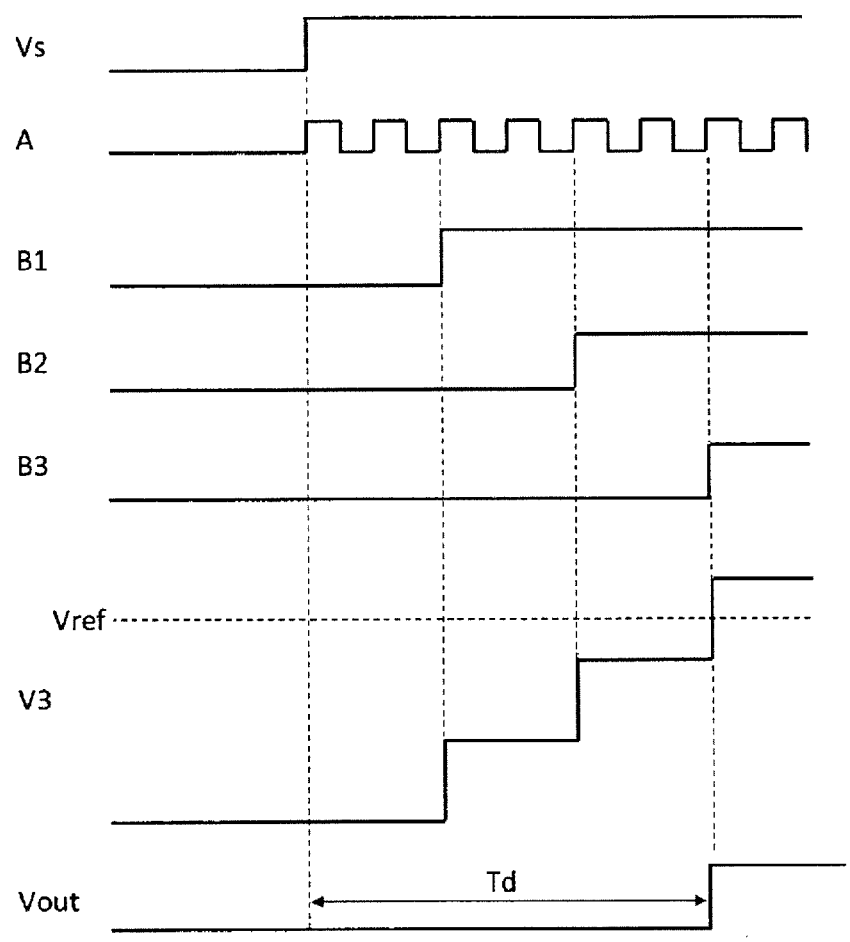
FIG. 2 is a timing chart of the delay circuit according to the present embodiment.
Figure 3:
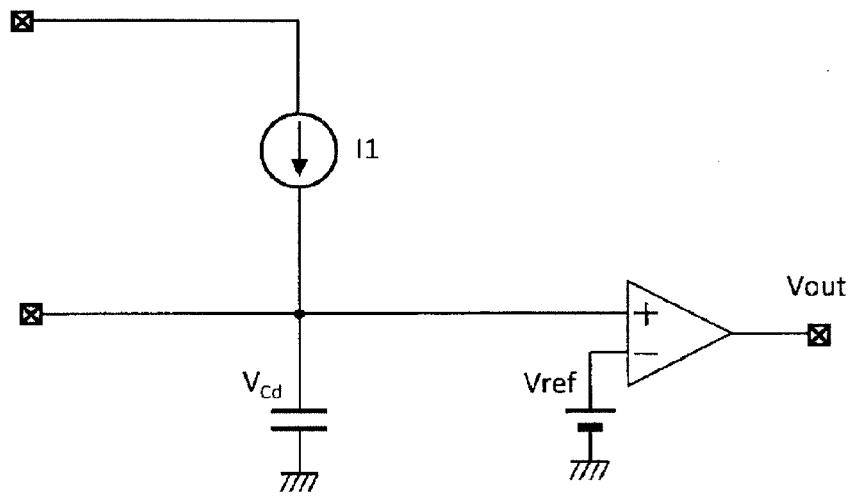
FIG. 3 is a circuit diagram illustrating a related art delay circuit.
Figure 4:
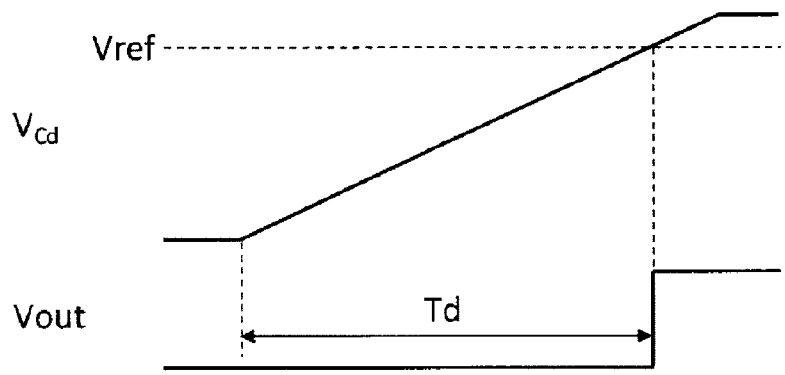
FIG. 4 is a timing chart of the relate art delay circuit.

Further, as is apparent from FIG. 2, the voltage V3 of the delay time adjustment terminal 3 stepwise rises by the product of the current of the current source and the resistance value of the resistor 17. Accordingly, for example, the resistor 17 is selected in such a manner that the reference voltage Vref becomes an intermediate voltage between the voltage V3 when the switch 44 is turned OFF and the voltage V3 when the switch 44 is turned ON. If done in this way, the resistance value of the resistor 17 does not influence the delay time Td even if the resistance value thereof fluctuates by a few %, thereby making it possible to realize a highly accurate delay circuit.

Incidentally, appropriate selection of the currents of the current sources makes it possible to cope with the amount of a variation in the resistance value of the resistor 17.

Further, the setting of the delay time Td can be adjusted by adjusting the reference voltage Vref by trimming or the like.

Furthermore, although the constant current source 13 is configured to always make the current to flow to the delay time adjustment terminal 3, the constant current source 13 may be eliminated.

What is claimed is:

1. A delay circuit comprising:
   a signal input terminal;
   an output terminal;
   a delay time adjustment terminal;
   a plurality of constant current sources;
   a plurality of switches respectively provided between the constant current sources and the delay time adjustment terminal;
   a control circuit which ON/OFF-controls the switches temporally; and
   a comparator circuit which compares a voltage of the delay time adjustment terminal and a reference voltage,
   wherein the control circuit sequentially turns ON the switches every preset period after a signal is inputted to the signal input terminal and sets as a delay time, a time taken for the comparator circuit to detect that the voltage of the delay time adjustment terminal exceeds the reference voltage.

2. The delay circuit according to claim 1, wherein the control circuit includes an oscillation circuit connected to the signal input terminal, and a counter which outputs signals for turning ON the switches in response to a clock of the oscillation circuit.

3. The delay circuit according to claim 1, including a constant current source which always allows a current to flow to the delay time adjustment terminal.

4. The delay circuit according to claim 2, including a constant current source which always allows a current to flow to the delay time adjustment terminal.

5. A semiconductor device comprising a delay circuit according to claim 1.

* * * * *